(12) United States Patent
Whetsel

(10) Patent No.: US 6,694,467 B2
(45) Date of Patent: Feb. 17, 2004

(54) LOW POWER TESTING OF VERY LARGE CIRCUITS

(75) Inventor: Lee D. Whetsel, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/336,985

(22) Filed: Jan. 6, 2003

(65) Prior Publication Data

US 2003/0106003 A1 Jun. 5, 2003

Related U.S. Application Data

(62) Division of application No. 09/339,734, filed on Jun. 24, 1999, now Pat. No. 6,519,729.

(51) Int. Cl.⁷ .............................................. G01R 31/28
(52) U.S. Cl. ..................................................... 714/729
(58) Field of Search ................................. 714/724, 726, 714/729

(56) References Cited

U.S. PATENT DOCUMENTS 4,947,395 A * 8/1990 Bullinger et al. ........... 714/730
5,428,622 A * 6/1995 Kuban et al. ............... 714/729

FOREIGN PATENT DOCUMENTS

JP          402148147 A * 6/1990 ........... G06F/11/22

* cited by examiner

*Primary Examiner*—Albert Decady
*Assistant Examiner*—C Britt
(74) *Attorney, Agent, or Firm*—Lawrence J. Bassuk; W. James Brady; Frederick J. Telecky, Jr.

(57) ABSTRACT

Plural scan test paths (401) are provided to reduce power consumed during testing such as combinational logic (101). A state machine (408) operates according to plural shift states (500) to control each scan path in capturing data from response outputs of the combinational logic and then shifting one scan path at a time to reduce the capacitive and constant state power consumed by shifting the scan paths.

4 Claims, 2 Drawing Sheets

LOW POWER TESTING OF VERY LARGE CIRCUITS

This application is a divisional of prior application Ser. No. 09/339,734, filed Jun. 24, 1999 now U.S. Pat. No. 6,519,729.

FIELD OF THE INVENTION

This invention relates generally to reducing the power needed to test very large integrated and other circuits with serial and parallel scan paths and in particular relates to reducing the power required to perform these tests by dividing the scan paths into shorter scan paths and shifting each shorter scan path separately.

BACKGROUND

As transistor and interconnect geometry's shrink, the number of transistors capable of being connected together to form circuits in an integrated circuit (IC) increases. Also, the speed at which these circuits operate increases. With these increases in density and speed, the power consumed by circuits in an IC increases. The power consumed by an IC, according to the present invention, is of two general types, (1) the power consumed during functional operation of the IC, and (2) the power consumed during test operation of the IC. The functional operation power is the power consumed by the IC when it is operating in a system, such as a digital signal processor (DSP) IC operating in a cellular telephone. The test operation power is the power consumed by the IC when it is being tested, for example by a wafer or IC tester. In some instances, the test operation power may be much greater than the functional operation power.

According to the present invention, the test operation power is the power consumed by the IC or die when it is tested using the well known scan test methodology. As mentioned, the test operation power consumed during scan testing can be much greater than the functional operation power. This is because potentially all circuit registers (latches or DFFs), which are configured into scan cells, may be simultaneously clocked to shift data in and out during test. This differs from functional operation mode, where all circuit registers are not typically clocked simultaneously. In scan test mode, clocking all or near all circuit registers simultaneously causes the combinational logic connected to the registers to be dynamically activated. Dynamically activating the combinational logic during scan operations can cause the circuit to consume a significant amount of power.

SUMMARY OF THE INVENTION

The present invention provides a method of reducing the test operation power by improving upon the scan test methodology such that only portions of the scan circuitry are activated at any one time. By activating only portions of the overall scan circuitry, the power consumed during scan testing can be significantly reduced, especially in ICs designed with CMOS technology. Advantageously, the present invention achieves this lower power scan mode without increasing test time over the conventional scan test methodology. The improvements brought forth by the present invention can be applied in both single scan path test methodologies and in parallel scan path test methodologies. While the following description will teach the improvement as being incorporated in an IC, the improvement can be used at any level of circuit implementation. For example, intellectual property (IP) cores, which are predesigned subcircuits used to design highly complex system ICs, may themselves incorporate the improvement to lower their power consumption during test inside the system IC.

DETAILED DESCRIPTION

Figure 1:
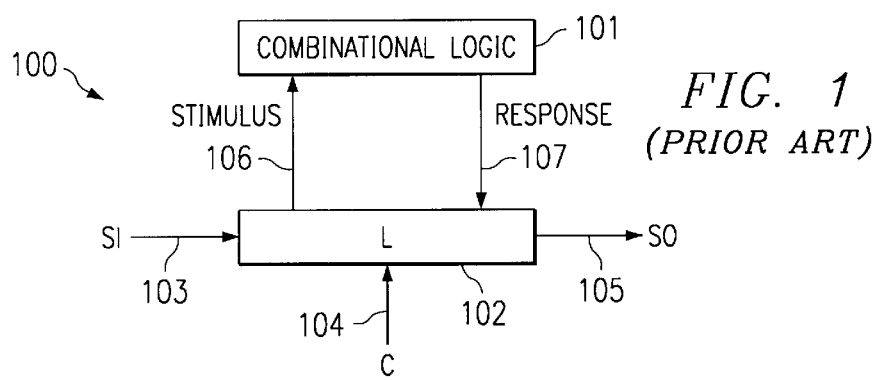
FIG. 1 is a block diagram of a known scan test arrangement.

In FIG. 1 a circuit 100 is placed in a conventional scan test mode. The circuit 100 could be an IC or die, or a subcircuit (core) within an IC or die. In functional mode, the circuit could be a microprocessor, DSP, serial I/O peripheral, or other circuit function. The model illustrates that, during scan test mode, the circuit is partitioned into combinational logic 101 and scan path 102. Scan path 102 comprises functional registers of the circuit (latches/DFFs) 101 that are converted, during test mode, into serially connected scan cells.

The number of serially connected scan cells determines the length (L) of scan path 102. Each scan cell provides a stimulus input to and response output from combinational logic 101 using interconnects 106 and 107, respectively. The interconnects 106 and 107 are the same interconnects used by the functional registers to communicate functional input and output to the combinational logic during the functional operational mode of the circuit. Scan path 102 receives serial input (SI) 103 and control input (C) 104 from a test controller and outputs serial output (SO) 105 to a test controller (not shown). The test controller could be realized as a test controller internal to the IC, or a test controller external to the IC, such as a wafer or IC tester.

During test, scan path 102 receives control input from control input C 104 to capture response data from combinational logic 101 into the scan cells. Next, the scan path receives control from input C 104 to shift captured response data out via output SO 105 and to shift new stimulus data in via input SI 103. The combinational logic responds to the new stimulus data to produce the next response data. The process of capturing response data, then shifting the scan path to output captured response and input new stimulus occurs repeatedly until the combinational logic has received all required stimulus data and has output all response data. This process is well known in the art of scan testing.

Equation 1 below indicates the number of scan cycle clocks required during each capture and shift operation of scan path 102. Equation 2 below indicates the scan cycle time. These equations will be used later to illustrate that use of the invention does not increase test time of the circuit.

$$\text{Scan Cycle Clocks} = \text{Capture Clock} + (\text{Shift Clocks})L = (1+L) \qquad 1$$

$$\text{Scan Cycle Time} = (1+L) * \text{Scan clock period } (T) = (1+L)T \qquad 2$$

where:
L=Scan cell length
T=Scan clock period

In scan path design, the number of scan cells tracks the number of functional registers of the circuit. In today's circuits, it is not uncommon to see scan paths comprising up to 30 thousand scan cells. In tomorrow's circuits, a scan path may comprise many more scan cells.

The invention addresses the problem of the connected combinational logic seeing simultaneous transitions on the stimulus inputs 106 from each scan cell as the scan path 102 shifts data. For example, if 30 thousand scan cells are shifted, the combinational logic sees simultaneous transitions on 30 thousand inputs. The combinational logic, can be viewed as hundreds of thousands of tiny interconnected capacitors (i.e. CMOS gate input and output capacitance, and gate to gate interconnect capacitance), each potentially charging and discharging each time data shifts along the scan path. Simultaneously charging and discharging these tiny capacitors produces large current flows in the circuit interconnects and transistors that can quickly heat up the circuit during scan testing. While today's circuits may not be damaged or degraded by the heat generated by combinational logic during scan testing, it is clear that tomorrow's circuits may be damaged or degraded by all this heat. If tomorrow's circuits heat beyond accepted levels during scan testing, steps will need to be taken to anticipate this problem.

One known way of preventing this problem would be to freeze the stimulus inputs 106 to the combinational logic during shift operations, by inserting circuitry, such as a gate, in each interconnect between the scan path and combinational logic. During shift operations the circuitry would be disabled from driving the combinational logic until after the scan path has been loaded with the stimulus input pattern. However, this adds a significant amount of test circuitry overhead, and inserts an undesirable delay into the interconnects that can negatively impact functional performance. Another alternative may be to cool the circuit during test via exotic and expensive cooling apparatuses, such that heat generated by a tested circuit is quickly transferred to the cooling apparatus. The present invention provides a solution to the problem without incurring the problems and expenses mentioned above.

Figure 2:
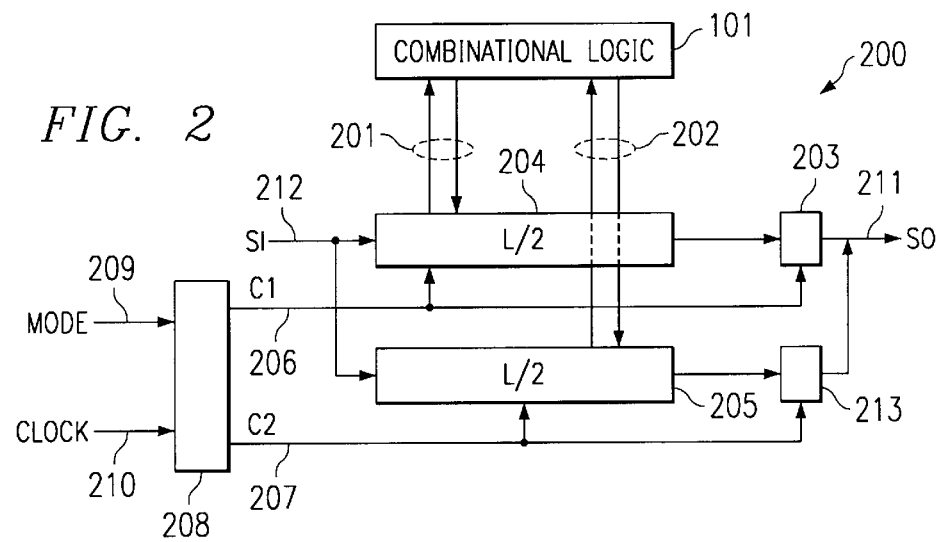
FIG. 2 is a block diagram of a scan test system according to the present invention.

In FIG. 2, circuit 200 has been configured such that the combinational logic 101 is tested using two separate scan paths 204 and 205. While reconfigured, scan paths 204 and 205 maintain the same scan cells, and same stimulus and response connections 201 and 202 to combinational logic 101 as scan path 102 of FIG. 1. The scan paths 204 and 205 are produced by dividing the number of scan cells (L) in scan path 102 by two (L/2), such that the scan cell lengths of scan paths 204 and 205 are preferably one half the scan cell length of scan path 102. If the number of scan cells (L) in 102 is not equally divisible by 2, then scan paths 204 and 205 may not contain an exactly equal number of scan cells, i.e. one of the scan paths 204 or 205 may contain an additional remainder scan cell. If one scan path includes an additional remainder scan cell, a dummy scan cell may be added to the other scan path to equalize the length between both scan paths, if desired.

In FIG. 2, the serial input (SI) 212 is connected to the inputs of both scan path 204 and 205, and the output from each scan path 204 and 205 is connected via 3-state devices 203, 213 to the serial output (SO) 211. Also, a scan control state machine 208 is added and connected to scan paths 204 and 205 via control 1 (C1) bus 206 and control 2 (C2) bus 207. The state machine 208 receives mode 209 and clock 210 control inputs.

Figure 3:
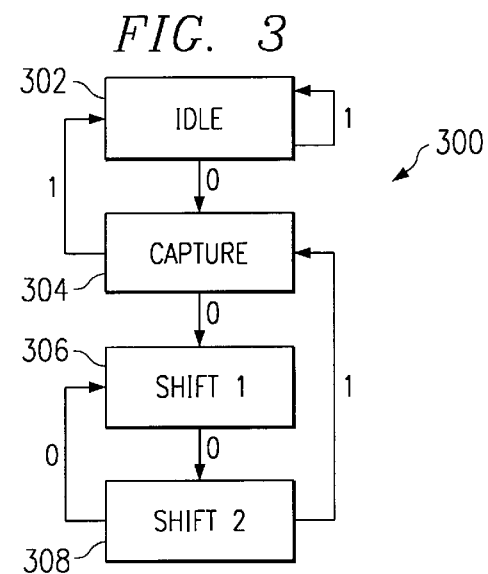
FIG. 3 is a flow chart of the states of a state machine.

In FIG. 3, the state diagram 300 depicts the operation of the state machine 208 that is timed by clock 210 to transition between its states in response to mode signal 209. The state machine effects the states of Idle 302, Capture 304, Shift 1 306, and Shift 2 308 states. The state machine is forced into in the Idle state when the circuit 200 is in its functional operation mode. The circuit 200 enters its functional operation mode at power up or after receiving a reset signal. The circuit transitions from functional operation mode to test operation mode by a test enable signal typically input from an IC pad. FIG. 2 represents the test operation mode configuration of the circuit. When circuit 200 enters the test operation mode, the state machine is enabled to respond to mode input 209 to transition from the Idle state 302 to the Capture state 304.

In the Capture state 304, control is issued on control lines C1 206 and 02 207 to cause both scan paths 204 and 205 to capture response data from the combinational circuit via interconnects 201 and 202. From the Capture state 304, the state machine transitions to the Shift 1 state 306. In the Shift 1 state, the state machine disables the C2 output 207, and enables the C1 output 206. This connects the output of scan path 204 to the output SO 211, via 3 state device 203, and performs a shift step to input data from input SI 212 to scan path 204 and output data to output SO 211 from scan path 204.

From the Shift 1 state, the state machine transitions to the Shift 2 state. In the Shift 2 state, the state machine disables the C1 output 206, and enables the C2 output 207. This connects the output of scan path 205 to the output SO 211, via 3 state device 213, and performs a shift step to input data from input SI 210 to scan path 205 and output data to output SO 211 from scan path 205.

From the Shift 1 state, the state machine transitions to the Shift 2 state. In the Shift 2 state, the state machine disables the C1 output, and enables the C2 output. This connects the output of scan path 205 to the output SO 211, via 3-state device 203, and performs a shift step to input data from input SI 210 to scan path 205 and output data to output SO 211 from scan path 205.

From the Shift 2 state, the state machine transitions to the Shift 1 state and repeats the Shift 1 operations described above. From the Shift 1, the state machine transitions to the Shift 2 state and repeats the Shift 2 operation described above. This loop between Shift 1 and Shift 2 continues until both scan paths 204 and 205 have filled with the next stimulus data and are emptied of the previous response data. When this occurs, the state machine transitions from the Shift 2 state to the Capture state 304. In the Capture state, the state machine outputs control on both C1 and C2, as previously mentioned, to cause both scan paths 204 and 205 to capture the next response data from the combinational logic 101.

The state machine 208 thus operates by transitioning into the Capture state to capture response data into scan paths 204 and 205; loops through the Shift 1 and Shift 2 states to fill and empty the scan paths 204 and 205; and repeats until the combinational logic has received all required stimulus data and has output all required response data. When the last response data has been shifted out of scan paths 204 and 205, the state machine transitions from the Shift 2 state to the Idle state, via the Capture state.

Equation 3 below indicates the number of scan cycle clocks required during each capture and shift operation of FIG. 2. Equation 4 below indicates the scan cycle time. L/2 in equation 3 indicates that the scan paths 204 and 205 each contain one half the scan cells of the scan path 102 in FIG. 1. In comparing equations 1 and 3, the same number of scan clocks are required to scan test the circuits of FIGS. 1 and 2. In comparing equations 2 and 4 it is seen that the scan test times of both circuits are the same, except for one added clock used at the start of the test to transition from the Idle state to the Capture state, and for two added clocks at the end of test used to transition from the Shift 2 state to the Idle state, via the Capture state. These three added clocks are insignificant compared to the hundreds of thousands of clocks used during the test, and are therefore not included in the equation 4.

$$\text{Scan Cycle Clocks} = \text{Capture Clock} + (\text{Shift 1 Clock} + \text{Shift 2 Clock})(L/2) = (1+L) \quad 3$$

$$\text{Scan Cycle Time} = (1+L)T \quad 4$$

In FIG. 2, when scan path 204 is shifted, scan path 205 is not shifted, and when scan path 205 is shifted, scan path 204 is not shifted. This means that the shift frequency of each scan path 204 and 205 is one half the shift frequency of scan path 102 in FIG. 1. For example, using the same shift clock frequency, if the shift frequency of scan path 102 is 20 Megahertz, the shift frequency of scan path 204 and 205 is only 10 Megahertz.

Reducing the shift frequency of scan paths 204 and 205 by one half reduces the transition frequency of stimulus inputs 201 and 202 to the combinational logic by one half. Reducing the stimulus input transition frequency by one half reduces the charge and discharge frequency of the previously mentioned internal capacitance of the combinational logic by one half. Reducing the charge and discharge frequency by one half reduces the power consumed by the combinational logic by one half.

Dynamic power consumed by a circuit can be approximated using equation 5 below. In equation 5, C represents a capacitance being charged/discharged, V represents the circuit voltage (Vcc), and F represents the charge/discharge frequency. In this case, the capacitance (C) being charged and discharged is the previously mentioned internal capacitance of combinational logic 101, and the frequency (F) is the transition frequency of stimulus inputs to the combinational logic as data shifts along the scan path(s). In equation 5, for a fixed C and V, the power varies proportionally with F. For example, setting variables to 1, i.e. C=1, V=1, F=1 results in Power=1. Substituting in F=½ results in Power=½.

$$\text{Power} = C*V^2*F \quad 5$$

Figure 4:
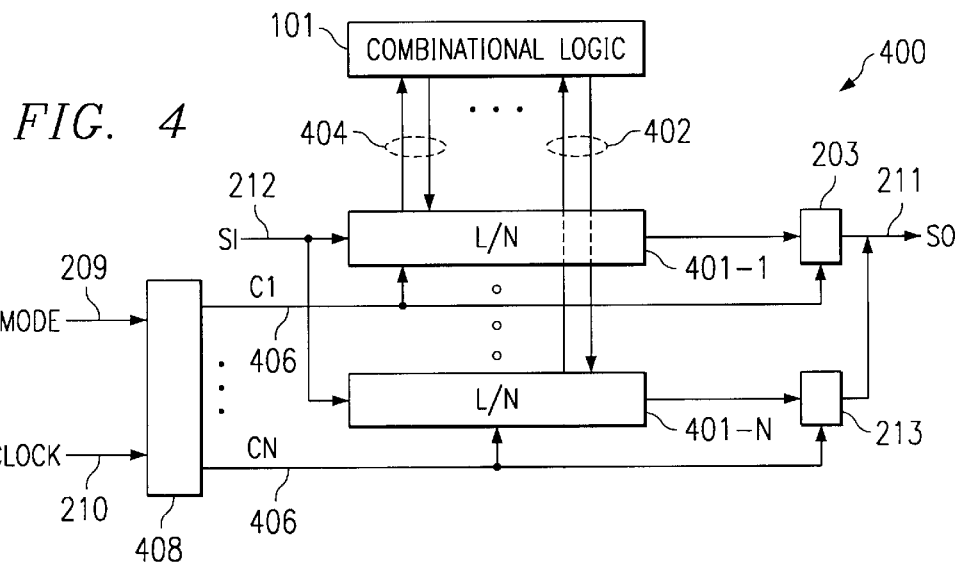
FIG. 4 is a another block diagram of a scan test system according to the present invention.

In FIG. 4, circuit 400 is an embodiment where the scan path 102 of FIG. 1 is further divided into plural scan paths 401-1 to 401-N. The scan paths 401 are divided such that each contains an equal or near equal number of scan cells, depending upon whether the number of scan cells in scan path 102 is equally divisible by N. If not equally divisible by N, the scan path 401 lengths can be represented by (L+1)/N, instead of by L/N, to indicate the presence of the previously mentioned remainder scan cell in one of the scan paths 401.

State machine 408 in FIG. 4 is the same as state machine 208 described in FIG. 2, except that it provides additional control outputs C1 to CN 406, each connected to one of scan paths 401-1 to 401-N. Each scan path input is connected to serial input SI 212 and each scan path output is connected to serial output SO 211 via 3-state devices 203,213, as in FIG. 2. Each scan path is connected to separate portions of the combinational logic 101 inputs and outputs via connections 402 and 404.

Figure 5:
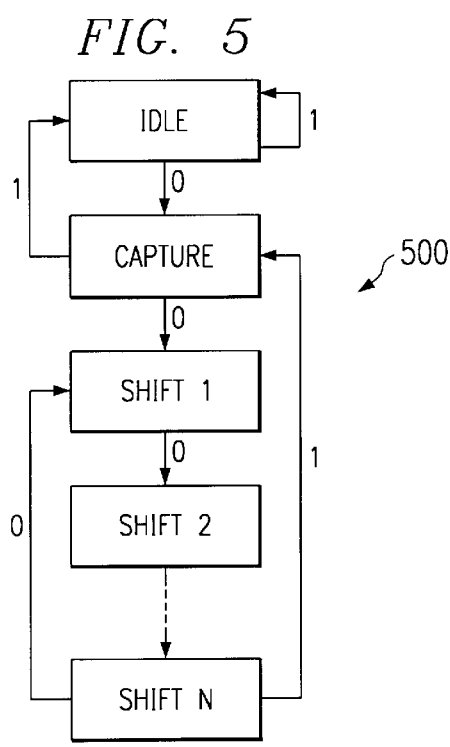
FIG. 5 is a flow chart of the states of a state machine.

In FIG. 5, the state diagram 500 for the state machine 408 has N shift states. The state diagram is identical to one described in FIG. 3, with the exception that it provides additional Shift states (3-N) to provide additional separate control (C3-N) outputs for shifting data through additional scan paths 3-N.

The reason for showing FIGS. 4 and 5 is to illustrate the ability of the present invention to further reduce power consumed by the circuit during scan testing by dividing the original scan path 102 into N separate scan paths. As seen in the general equations 6 and 7 below, the test time of the circuit 400 arrangement is the same as the circuit arrangements in FIGS. 1 and 2.

$$\text{Scan Cycle Time} = \text{Capture} + (\text{Shift1} + \text{Shift2}, \ldots + \text{Shift}N)L/N = (1 + 10L/10) = (1+L) \quad 6$$

$$\text{Scan Cycle Time} = (1+L)T \quad 7$$

Figure 6:
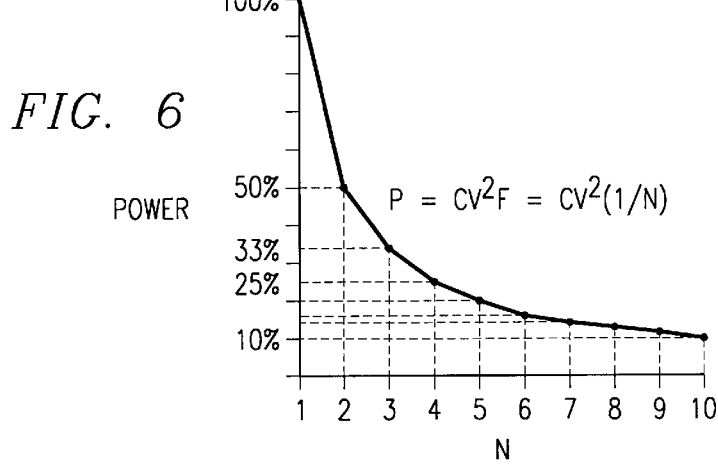
FIG. 6 is a graph of power versus number of scan paths.

In FIG. 6, the plot of circuit Power vs number of scan paths (N), 1/N is substituted for F. According to the present invention, F is equal to the reciprocal of the number (N) of separately controlled scan paths. This can be seen in the state diagram 500, where each scan path 1-N is shifted once during each pass through the Shift 1-N state loop, making the frequency of each scan path equal to 1/N.

The graph depicts that dividing scan path 102 of FIG. 1 up into separate scan paths N and operating the separate scan paths as described in FIGS. 2, 3, 4, and 5 decreases power consumed by the circuit during scan test. In the graph, when N=1, as is the case for scan path 102 of FIG. 1, the most power is consumed during test, which is assigned a percentage of 100%. When N=2, as is the case for scan paths 204 and 205 in FIG. 2, the power consumed drops to 50%. When N=3, as is the case when N=3 in FIG. 4, power consumed drops to 33%. When N=4, power drops to 25%, and so on. When N=10, power drops to 10%. Power would continue dropping as N increases. As seen in the graph, the most power drop occurs.

Figure 7:
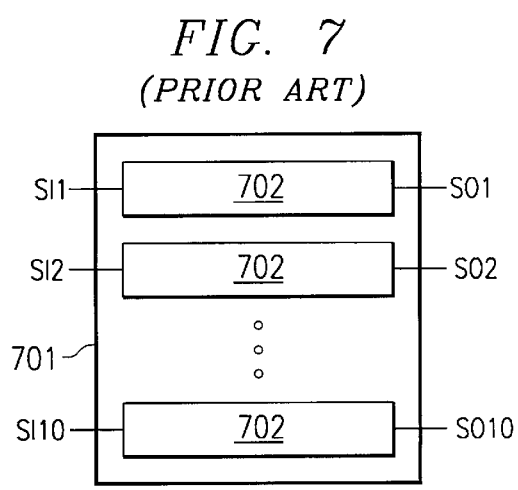
FIG. 7 is a block diagram of a known parallel scan path test arrangement that can be modified according to the present invention.

In FIG. 7, a conventional parallel arrangement 701 of scan paths has ten scan paths 702, each having a serial input (SI1-10) and serial output (SO1-10). During test, each scan path receives serial input and sends serial output as a bussed group of signals. The arrangement 701 operates according to the conventional capture and shift control (C) described in regard to the scan path 102 of FIG. 1. The difference between scan path 102 and parallel scan path arrangement 710, is that parallel scan path arrangement 701 inputs and outputs on a plurality of serial inputs (SI1-10) and serial outputs (SO1-10), respectively.

The reason for showing the parallel scan path arrangement 701 is to indicate that parallel scan path arrangements can be divided into separate parallel scan path arrangements and be used in the present invention. For example if the parallel scan path arrangement 701 were substituted for scan path 102 in FIG. 1, FIG. 2 could be viewed as representing two separate parallel arrangements 204 and 205, each having a scan cell length (L/2) equal to or near equal to one half the scan cell length of arrangement 701. The state machine 208 operation remains identical to that previously described. The only differences would be that; (1) serial input (SI) and serial output (SO) would occur as a bussed group of serial input (SI) and serial output signals (SO), instead of via a single serial input (SI) and a single serial output (SO), and (2) additional 3-state devices would be required for each serial output (SO) signal bussed out from parallel scan path arrangements 204 and 205. These same differences would be seen in the general representation of the present invention in FIG. 4. From equations 1 & 2 and 3 & 4 it can be seen that the test times for testing parallel scan path arrangements using the present invention remains equal to testing conventional parallel scan path arrangements. Also from equation 5, it can be determined that the same power reduction occurs when using the present invention with parallel scan path arrangements.

When using either single or parallel scan path arrangements in the present invention, the scan test times remain the same as conventional single or parallel scan testing, while, advantageously, the power consumed during test is reduced as shown in the graph of FIG. 6.

The scan controller 208 state diagram of FIG. 3 may be altered such that more than one shift operation is performed during the Shift 1 and Shift 2 states. For example, the state diagram could operate such that; (1) when the Shift 1 state is entered, it is maintained, by mode input 209, for a number of clock inputs 210 required to shift all data into scan path 204, (2) when the Shift 2 state is entered, it is maintained, by mode input 209, for a number of clock inputs 210 required to shift all data into scan path 205, and (3) repeating the loop between Shift 1 and Shift 2 until the test is completed. This applies also to the general state diagram of FIG. 5. The power reduction advantage of the present invention is maintained independent of the number of shift operations performed in the Shift 1 and Shift 2 state because only one of the scan paths 204 or 205 is being shifted at any given time.

While the present invention has been described in detail, alterations or improvements may be made without departing from its basic nature and scope.

I claim:

1. A process of testing a functional circuit comprising:

A. capturing response data from the functional circuit in scan cells of plural serial scan paths;

B. shifting the captured response data out of and stimulus data into one of the serial scan paths;

C. disabling all the other serial scan paths from shifting while shifting the captured response data out of and stimulus data into one of the serial scan paths;

D. shifting the captured response data out of and stimulus data into another one of the serial scan paths;

E. disabling all the other serial scan paths from shifting while shifting the captured response data out of and stimulus data into the another one of the serial scan paths;

F. shifting data through equal numbers of scan cells in each serial scan path; and G. applying the stimulus data to the functional circuits from the plural serial scan paths.

2. The process of claim 1 including shifting the captured response data to one serial data output lead from all the serial scan paths.

3. The process of claim 1 including shifting the stimulus data into all the serial scan paths from one serial data input lead connected to the input of the first scan cell in all the serial scan paths.

4. The process of claim 1 in which the shifting through equal numbers of scan cells in each serial scan path includes shifting through at least one dummy scan cell in a serial scan path.

* * * * *